United States Patent [19]

Fujisaki

[11] Patent Number: 4,958,346
[45] Date of Patent: Sep. 18, 1990

[54] MEMORY TESTING DEVICE

[75] Inventor: Kenichi Fujisaki, Gyoda, Japan

[73] Assignee: Advantest Corporation, Tokyo, Japan

[21] Appl. No.: 292,100

[22] Filed: Dec. 30, 1988

[30] Foreign Application Priority Data

Jan. 11, 1988 [JP] Japan .................................. 63-4181

[51] Int. Cl.⁵ .............................................. G06F 11/00
[52] U.S. Cl. ................................... 371/21.3; 371/25.1; 371/27
[58] Field of Search ..................... 321/21.2, 21.3, 21.1, 321/25.1, 27; 365/201; 358/314, 327, 10, 139

[56] References Cited

U.S. PATENT DOCUMENTS

| | | | |
|---|---|---|---|
| 4,369,511 | 1/1983 | Kimura | 371/21.2 |
| 4,370,746 | 1/1983 | Jones | 371/21.1 X |
| 4,389,677 | 6/1983 | Rushby | 371/27 X |
| 4,775,857 | 10/1988 | Staggs | 371/21.2 X |
| 4,788,684 | 11/1988 | Kawaguchi | 371/21.2 |
| 4,807,229 | 2/1989 | Tada | 371/27 |
| 4,835,774 | 5/1989 | Ooshima | 371/21.2 |

Primary Examiner—Jerry Smith
Assistant Examiner—Robert W. Beausoliel
Attorney, Agent, or Firm—Staas & Halsey

[57] ABSTRACT

A device for testing a memory into which data can be written in a flash mode, includes a buffer memory which has a storage capacity equal to that of the memory under test, and a pattern generator for generating an address and data for input into the buffer memory. A data register stores the same data as that which is written into the memory under test during its flash write. A multiplexer selects either one of the data stored in the data register and the data from the pattern generator, and provides the selected data to the buffer memory. A logical comparator receives, as an expected value, data read out of the buffer memory and makes a logical comparison between it and data read out of the memory under test.

1 Claim, 5 Drawing Sheets

FIG. 3 PRIOR ART

|  |  |  |  |  | COLUMN ADDRESS | | | | | | | | ROW ADDRESS | | | | | | | |
|---|---|---|---|---|---|---|---|---|---|---|---|---|---|---|---|---|---|---|---|---|
|  |  | R | G | B | C | $A_0$ | $A_1$ | $A_2$ | $A_3$ | $A_4$ | $A_5$ | $A_6$ | $A_7$ | $A_8$ | $A_9$ | $A_{10}$ | $A_{11}$ | $A_{12}$ | $A_{13}$ | $A_{14}$ | $A_{15}$ |
| $M_1$ (256 ADDRESS) |  |  |  |  | 0 | 0 | 0 | 0 | 0 | 0 | 0 | 0 | 0 | 0 | 0 | 0 | 0 | 0 | 0 | 0 |
|  |  |  |  |  | 1 | 0 | 0 | 0 | 0 | 0 | 0 | 0 | 0 | 0 | – | – | – | – | – | 0 |
|  |  |  |  |  | 0 | 1 | 0 | 0 | 0 | 0 | 0 | 0 | 0 | 0 | – | – | – | – | – | 0 |
|  |  |  |  |  | 1 | 1 | 0 | 0 | 0 | 0 | 0 | 0 | 0 | 0 | – | – | – | – | – | 0 |
|  |  |  |  |  | 0 | 0 | 1 | 0 | 0 | 0 | 0 | 0 | 0 | 0 | – | – | – | – | – | 0 |
|  |  |  |  |  | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ |
|  |  |  |  |  | 1 | 1 | 1 | 1 | 1 | 1 | 1 | 0 | ⋮ | ⋮ | ⋮ |  |  |  |  | ⋮ |
|  |  |  |  |  | 1 | 1 | 1 | 1 | 1 | 1 | 1 | 1 | 0 | 0 | 0 | 0 | 0 | 0 | 0 | 0 |
| $M_2$ (256 ADDRESS) |  |  |  |  | 0 | 0 | 0 | 0 | 0 | 0 | 0 | 0 | 1 | 0 | 0 | 0 | 0 | 0 | 0 | 0 |
|  |  |  |  |  | 1 | 0 | 0 | 0 | 0 | 0 | 0 | 0 | 1 | 0 | – | – | – | – | – | 0 |
|  |  |  |  |  | ⋮ | ⋮ | ⋮ | ⋮ | ⋮ | ⋮ | ⋮ | ⋮ | 1 | 0 | – | – | – | – | – | 0 |
|  |  |  |  |  | ⋮ | ⋮ | ⋮ | ⋮ | ⋮ | ⋮ | ⋮ | ⋮ | 1 | 0 | – | – | – | – | – | 0 |
|  |  |  |  |  | ⋮ | ⋮ | ⋮ | ⋮ | ⋮ | ⋮ | ⋮ | ⋮ | ⋮ | ⋮ | ⋮ |  |  |  |  | ⋮ |
|  |  |  |  |  | 1 | 1 | 1 | 1 | 1 | 1 | 1 | 0 | 1 | 0 | 0 | 0 | 0 | 0 | 0 | 0 |
|  |  |  |  |  | 1 | 1 | 1 | 1 | 1 | 1 | 1 | 1 | 1 | 0 | 0 | 0 | 0 | 0 | 0 | 0 |
| $M_3$ (256 ADDRESS) |  |  |  |  | 0 | 0 | 0 | 0 | 0 | 0 | 0 | 0 | 0 | 1 | 0 | 0 | 0 | 0 | 0 | 0 |
|  |  |  |  |  | 1 | 0 | 0 | 0 | 0 | 0 | 0 | 0 | 0 | 1 | 0 | – | – | – | – | 0 |
|  |  |  |  |  | ⋮ | ⋮ | ⋮ | ⋮ | ⋮ | ⋮ | ⋮ | ⋮ | 0 | 1 | 0 | – | – | – | – | 0 |
|  |  |  |  |  | ⋮ | ⋮ | ⋮ | ⋮ | ⋮ | ⋮ | ⋮ | ⋮ | ⋮ | ⋮ | ⋮ |  |  |  |  | ⋮ |
|  |  |  |  |  | 1 | 1 | 1 | 1 | 1 | 1 | 1 | 0 | 0 | 1 | 0 | 0 | 0 | 0 | 0 | 0 |
|  |  |  |  |  | 1 | 1 | 1 | 1 | 1 | 1 | 1 | 1 | 0 | 1 | 0 | 0 | 0 | 0 | 0 | 0 |
|  |  |  |  |  | 0 | 0 | 0 | 0 | 0 | 0 | 0 | 0 |  |  |  |  |  |  |  |  |

(400)

MEMORY TESTING DEVICE

BACKGROUND OF THE INVENTION

The present invention relates to a device for testing memories which are used to store images, for instance.

In general, a semiconductor memory testing device has such an arrangement as shown in FIG. 1. An address signal is applied to a memory under test 200 from an address terminal 101 of a pattern generator 100, and data created by the pattern generator 100 at that time is provided from its data terminal 102 to the memory under test 200 and written therein at the specified address. Then, an address signal is applied from the pattern generator 100 to the memory under test 200 to read out therefrom the stored data. The thus readout data and data output from the pattern generator 100, that is, expected value data, are compared by a logical comparator 300 to determine whether the memory under test 200 is good or bad.

The pattern generator 100 is made up of an address generator 103, a data generator 104, a data memory 105, a clock control signal generator 106, and a sequence controller 107. The sequence controller 107 controls the address generator 103, the data generator 104, and the clock control signal generator 106. The address generator 103 generates an address signal which is applied to the memory under test 200. The data generator 104 generates, by a logical operation, data for input into the memory under test 200, that is, write data, and expected value data for input into the logical comparator 300. The data memory 105 also generates data for input into the memory under test 200 and expected value data for input into the logical comparator 300 which are prestored in the memory 105.

The data generator 104 is used to generate regular data and the data memory 105 to generate irregular, random data. A multiplexer 108 switches between the data generator 104 and the data memory 105. The clock control signal generator 106 generates a clock control signal which is applied to the memory under test 200.

The conventional semiconductor memory testing device shown in FIG. 1 cannot be employed for testing image memories recently developed.

Image memories heretofore employed have a random access port and a serial access port. The image memories are randomly accessed through the random access port. Through the serial access port an initial address is set and is then incremented one by one at high speed in response to a clock, for sequential access to respective memory addresses. A device for testing such dual port type memories has been proposed in Japanese Patent Kokai No. 269076/87, entitled "Semiconductor Memory Testing Device", laid open on Nov. 21, 1987.

Recently there has been developed an image memory which operates in pixel, plane, block and flash modes. In the case of providing a color display, a total of four bits for three pieces of color information R, G and B and one piece of control information C are employed as a smallest unit of pixel information PIX as shown in FIG. 2. Sometimes eight bits may be used for the pixel information PIX so as to increase the number of colors for display.

As shown in FIG. 2, each pixel information PIX at an arbitrary address is accessed using an address signal of $N+1$ bits $A_O$ to $A_N$ and individual pieces of pixel information PIX are sequentially stored in a memory in the direction of address depth. By sequentially or randomly reading out addresses in the direction of address depth, respective pieces of pixel information PIX can be read out and they can be written in a similar manner. This read/write mode is the pixel mode.

The plane mode is a mode of operation which accesses only single color information line by the same number of bits as that of the pixel information PIX. According to the plane mode, single color information can be re-written and read out in units of four bits, and a desired area of the display screen can be painted over with the color at high speed. The four-bit signal for effecting the re-write and the read-out at one time will hereinafter be referred to as plane information PLN.

The block mode is a mode of operation which reads and writes a memory space of, for example, a four-by-four bit plane, at one time. This mode is used for clearing, at high speed, a limited area of the display screen, for example, a multi-window.

The flash mode is a mode of operation in which data stored in a register built in the image memory is provided to all memory cells of one row address area whereby the same data can be written in the row address area at one time. For example, in the case of using a 16-bit address signal, one row address area is an area which includes $2^8$ address positions which are selected by all addresses whose high-order eight bits (a row address) have the same value, as shown in FIG. 3. On the other hand, respective address positions in each of row address areas $M_l$ to $M_k$ are selected by low-order eight bits (a column address) of the 16-bit address signal, where $k=256$. The image memory has a data register, and data stored in this data register is written into any one of the row address areas $M_l$ to $M_k$ at one time.

The image memory further has a mask register, in which mask data is stored. The mask data is used to mask desired bits of data during its write operation. Alternatively, new mask data obtained by ANDing the stored mask data and input mask data may also be used for masking desired bits.

Since the dual port type image memory has such various functions as mentioned above, it is difficult for the testing device to create expected value data for testing such functions.

In a test for determining whether data written in the flash mode can correctly be read out, it is particularly difficult to produce an expected value pattern under program control, because mask data must also be taken into account.

SUMMARY OF THE INVENTION

It is therefore an object of the present invention to provide a memory testing device which permits testing of memories even in the case of writing data in the flash mode.

According to an aspect of the present invention, the memory testing device includes: a buffer memory having the same storage capacity as that of a memory under test which is capable of writing the same data into memory cells of one row address area at one time in the flash mode; a data register for storing the same data as that to be written into the memory under test at the time of its flash write; a multiplexer for selecting either one of the data stored in the data register and input data and providing the selected data to a data input terminal of the data register; a mask data register for storing the same mask data as that which defines a mask to be assigned to the data that is written into the memory under test; and a mask controller whereby data to be written into the buffer memory is masked in accordance with the mask data stored in the mask register.

The same data as that which is written into the memory under test during its flash write mode is stored in the data register. The data thus stored in the data register is provided to the data input terminal of the buffer memory, wherein it is written in the address area corresponding to that of the memory under test.

The buffer memory is incapable of writing data in one row address area at one time unlike the memory under test. In view of this, according to the present invention, upon completion of writing data into the memory under test in the flash write mode, the memory under test is placed in the wait state and then the same data as that written into the memory under test is written into the corresponding row address area of the buffer memory. By reading out the data thus written into the row address area of the buffer memory, expected value data for the memory under test can be obtained.

Further, the same mask register as that incorporated in the memory under test is provided, and mask data stored in the mask register is used to mask the data to be written into the buffer memory. Thus, according to the present invention, the data which is written into the buffer memory is exactly the same as that to be written into the memory under test. By reading the buffer memory simultaneously with the readout of the memory under test, expected value data can be obtained from the buffer memory.

According to another aspect of the present invention, a second multiplexer is provided at the output side of the buffer memory.

The second multiplexer is switchable between bits to be masked and bits not to be masked. That is to say, when the memory under test is in the flash write mode, the buffer memory performs only operations of writing data into the data register and mask data into the mask register.

When the memory under test leaves the flash write mode, it is immediately switched to the read mode for reading out data written in the flash write mode. At this time, the second multiplexer selects the output bits of the data register for unmasked bits and the output bits of the buffer memory for masked bits. In this way, the data output from the second multiplexer agrees with the data read out of the memory under test, and hence can be employed as expected value data therefor.

In other words, the data which is written into the memory under test in the flash write mode is the same as that stored in the data register. The mask data is also masked at the same bits in the memory under test and the buffer memory. The contents of masked bits of data written in the memory under test and the buffer memory before the flash write mode still remain unchanged after the flash write mode.

Consequently, by outputting data from the data register for unmasked bits and data from the buffer memory for the masked bits, the same data as that read out of the memory under test is obtained and can be utilized as expected value data.

Also according to the second aspect of the invention described above, it is possible to test a memory which operates in the flash mode. In this instance, no dummy cycle is needed, because the expected value data can be output immediately after the memory under test finishes the flash write.

BRIEF DESCRIPTION OF THE DRAWINGS

FIG. 3 is a diagram for explaining row address areas of a memory under test;

DESCRIPTION OF THE PREFERRED EMBODIMENTS

Figure 1:
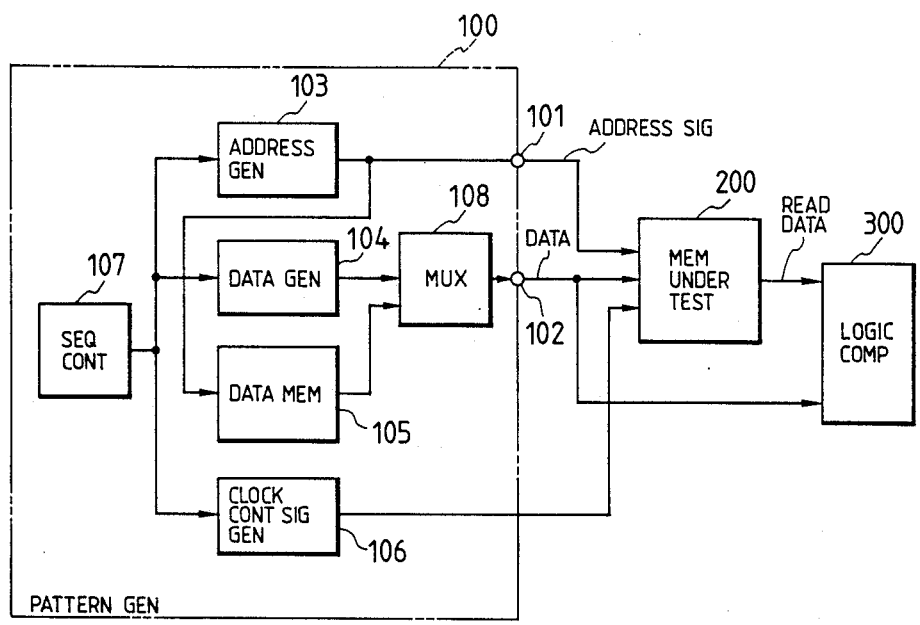
FIG. 1 is a block diagram of a conventional memory testing device.
Figure 4:
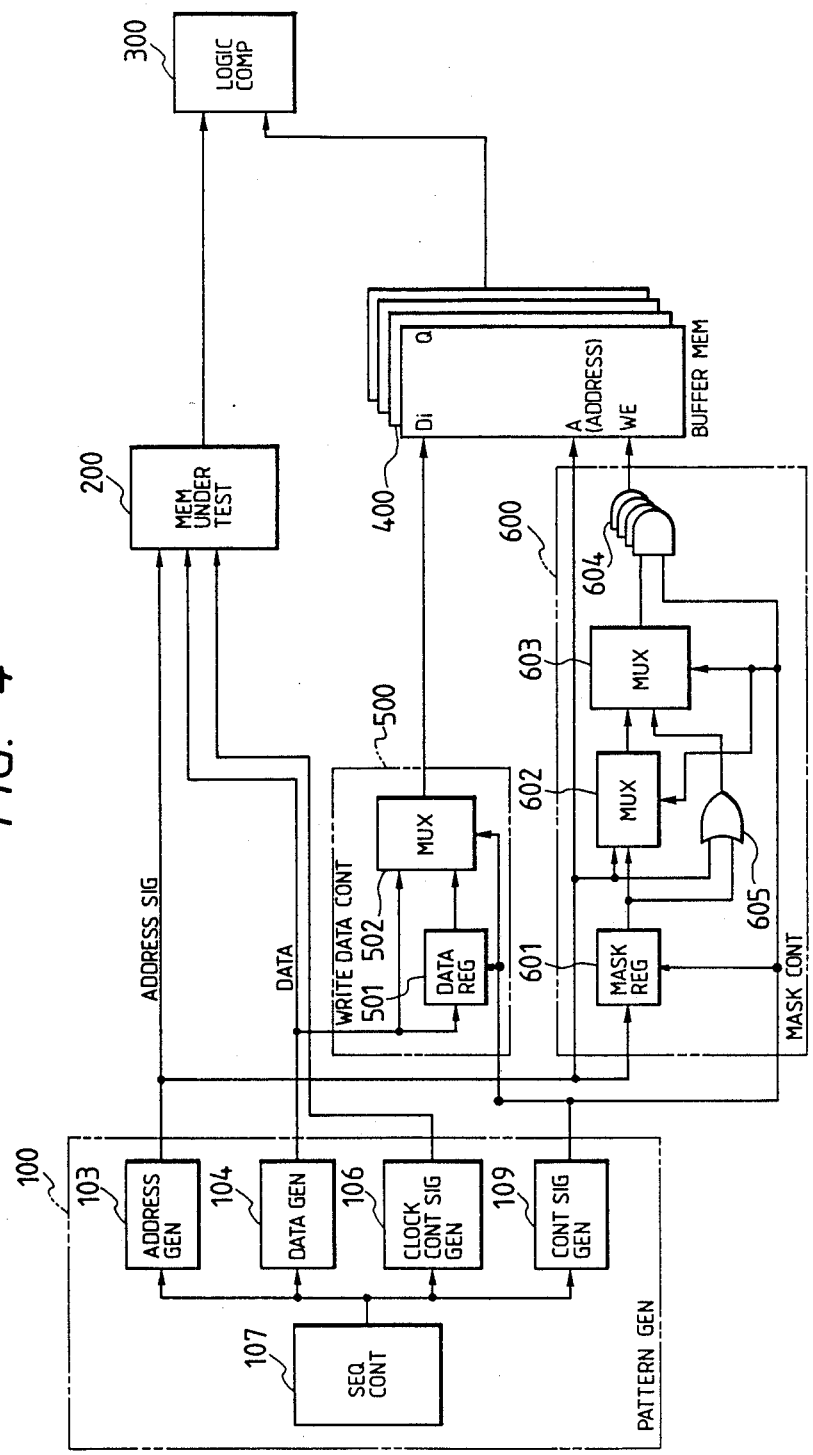
FIG. 4 is a block diagram of a first embodiment of the present invention.

FIG. 4 illustrates in block form an embodiment of the present invention, in which the parts corresponding to those in FIG. 1 are identified by the same reference numerals. This embodiment includes a buffer memory 400 which has a storage capacity equal to or greater than that of the memory under test 200, a write data controller 500 which effects control for writing data into the buffer memory 400, and a mask controller 600. The memory under test 200 is assumed to have functions equivalent to the write data controller 500 and the mask controller 600 used in this embodiment.

The write data controller 500 comprises a data register 501 and a multiplexer 502. When the memory under test 200 is in the flash write mode, flash write data is provided from the data generator 100 to the register in the memory under test 200, wherein it is written into the entire one row address area. At the same time, the flash write data is also provided to the data register 501 of the write data controller 500, which is enabled a control signal from a control signal generator 109 in the pattern generator 100.

The multiplexer 502 is controlled by a control signal from the control signal generator 109 such that in non-flash write modes, data sent from the data generator 104 is provided to a data input terminal Di of the buffer memory 400 and, in the flash write mode, flash write data stored in the data register 501 is provided to the data input terminal Di of the buffer memory 400.

In the case of masking data in the flash write mode, mask data is stored, for example, via an address bus, in a mask data storage register of the memory under test 200. At the same time, the same mask data is stored in a mask register 601 of the mask controller 600 based on a control signal produced by the control signal generator 109.

The mask data stored in the mask register 601 is provided via multiplexers 602 and 603 to an AND gate group 604, by which bits of, for instance, L-logic in the mask data cause to disable writing of corresponding bits into the buffer memory 400. That is, the output of the AND gate group 604 is applied to a write enable terminal WE of the buffer memory 400. The buffer memory 400 has memory chips of at least the same number as that of bits of data to be stored. A write command signal is applied from the AND gate group 604 to the write enable terminal WE of each memory chip. The write command signal is created by a the control signal generator 109 in the pattern generator 100. In this way, no write command signal is applied to the memory chip corresponding to each bit of the L-logic in the mask data, and consequently, re-writing of that bit is prohibited.

The multiplexer 602 is provided for selecting either one of input mask data sent via the address bus and the mask data stored in the mask register 601. The multiplexer 603 is provided for switching between the mask data selected by the multiplexer 602 and mask data obtaining by ORing the input mask data from the address generator 103 and the mask data stored in the mask register 601. The multiplexers 602 and 603 are controlled by control signals from the control signal generator 109 to effect the same masking state as in the memory under test 200.

The memory under test 200 is switched to the flash write mode by a signal for switching to the flash mode, which is provided from the clock control signal generator 106, and the same data is written into one row address area in one access time.

The buffer memory 400 is an ordinary memory, and hence has no function of writing data thereinto in the flash mode. According to the present invention, when the memory under test 200 is in the flash write mode, the buffer memory 400 is held in the wait state, and when the memory under test 200 leaves the flash write mode, the buffer memory 400 is placed in the write state, in which the data stored in the data register 501 is written, by sequential incrementation of the address signal from the pattern generator 100, into the same row address area as that of the memory under test 200 into which data was written in the flash write mode. In this write operation, the mask controller 600 masks desired bits of the write data in accordance with mask data stored in the mask register 601 or mask data obtained by ANDing the stored mask data and input mask data from the pattern generator 100.

Upon completion of the write into the buffer memory 400, the memory under test 200 and the buffer memory 400 are switched to the readout state, and their readout data are compared by the logical comparator 300, by which it is determined whether the memory under test 200 is good or bad.

As described above, according to the present invention, even if the memory under test 200 is one that is capable of operating in the flash write mode, the same data as that written into the memory under test 200 can be written into the corresponding address area of the buffer memory 400, and expected value data can be obtained from the buffer memory 400. Thus, the memory capable of operating in the flash write mode can be tested.

Moreover, the flash write data which is written into the buffer memory 400 can be masked, by the mask controller 600, at the same bits as those in the data written into the memory under test 200, and consequently, correct expected value data can be derived from even masked stored data.

Figure 5:
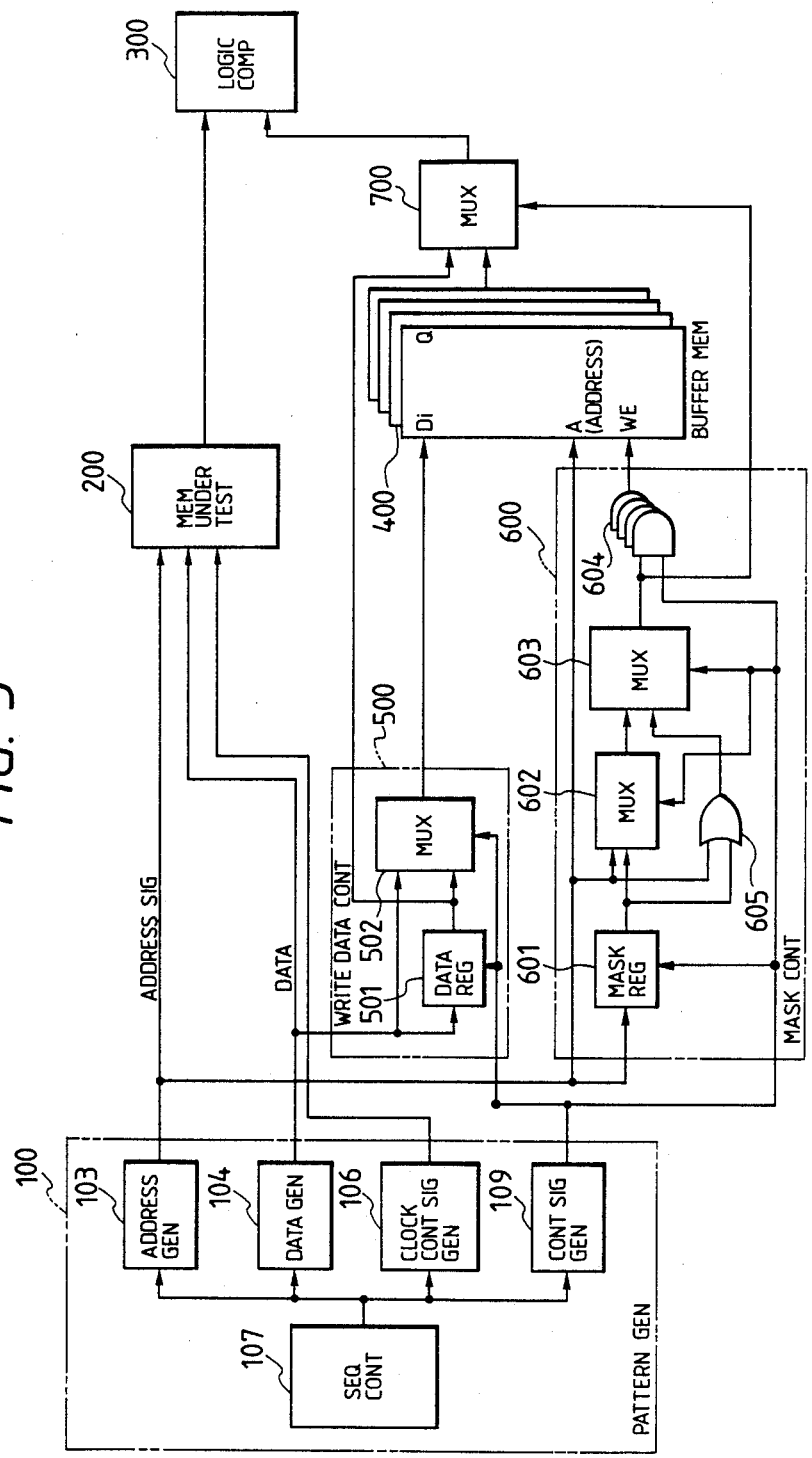
FIG. 5 is a block diagram of a second embodiment of the present invention.

FIG. 5 illustrates another embodiment of the present invention, in which a multiplexer 700 is provided at the output side of the buffer memory 400. The multiplexer 700 selects, as expected value data, either one of the data stored in the data register 501 and the data read out of the buffer memory 400. In this embodiment, at the same time as data is written into the memory under test 200 in the flash write mode, the same data is stored in the data register 501, and immediately thereafter the readout of the memory under test 200 is started. In this instance, the multiplexer 700 receives mask data from the mask controller 600 and, on the basis of this mask data, selects, for unmasked bits, the data in the data register 501 and, for masked bits, the output read out of the buffer memory 400. Thus, the data read out of the memory under test 200 agrees with the data provided from the multiplexer 700 and the latter can be utilized as expected value data.

In other words, the contents of the buffer memory 400 and the memory under test 200 immediately before the flash write are in agreement with each other, because the same data has been written in both of them until then. Accordingly, when the memory under test 200 enters the flash write mode, the same data as that stored in the data register 501 is written into the row address area of the memory under test 200 accessed at that time. Hence, when the flash write data to be written into the memory under test 200 is not masked at all, the data read out of the data register 501 by the multiplexer 700 can be used as expected value data without the need of reading out the contents of the buffer memory 400.

When the flash write data to the memory under test 200 is masked at a certain bit, re-writing of the masked bit is prohibited; so that the masked bit agrees in content with the corresponding bit of the data stored in the buffer memory 400. By reading out the data from the data register 501 for unmasked bits and the data from the buffer memory 400 for the masked bits and combining them, expected value data can be obtained.

According to the second embodiment, the flash write of data in the memory under test 200 can immediately be followed by its readout operation without effecting a write in the buffer memory 400, i.e. with no dummy cycle. That is, the flash write operation of the memory under test 200 can be tested immediately, and hence the time for testing can be reduced.

Figure 6:
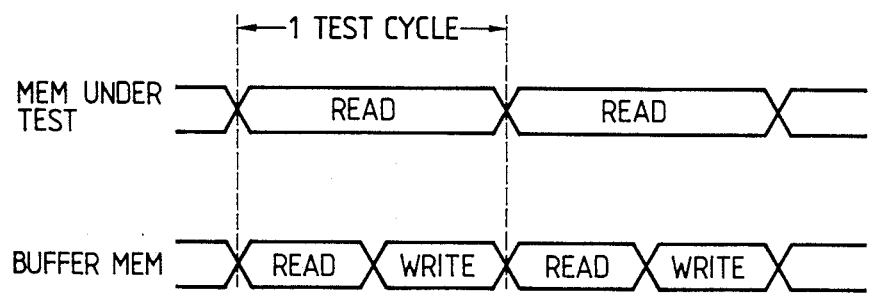
FIG. 6 is a waveform diagram for explaining the operation of the second embodiment.
Figure 2:
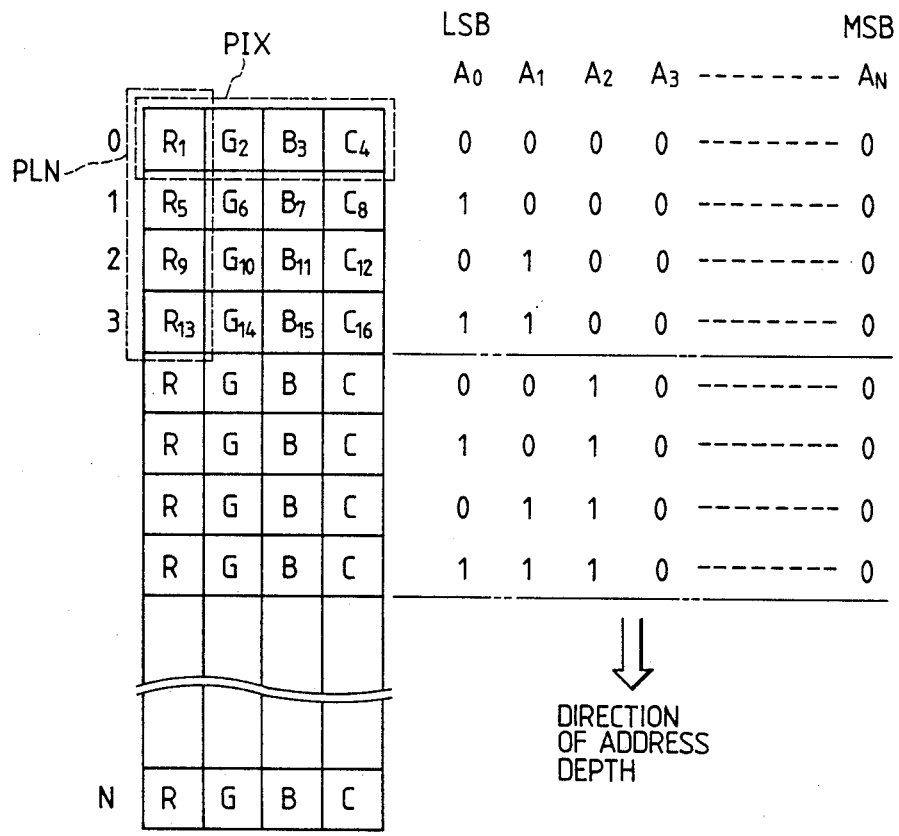
FIG. 2 is a diagram for explaining the internal structure of an image memory.

In the second embodiment, during the above-mentioned test the memory under test 200 is read out every test cycle, but the buffer memory can be operated for readout in the first half of each test cycle and for write in the second half, as shown in FIG. 6.

By such operation it is possible to write the contents of the data register 501 into the buffer memory 400 while masking them at desired bits during the testing of the flash write operation of the memory under test 200, by which the contents of the memory under test 200 and the buffer memory 400 can be brought into agreement with each other. Since the contents of the memory under test 200 and the buffer memory 400 can thus be brought into agreement, the next test can immediately be performed.

As described above, according to the present invention, special memories capable of operating in the flash write mode can be tested with a relatively simple arrangement. Hence the present invention offers a low-cost memory testing device for testing the flash write mode of operation.

It will be apparent that many modifications and variations may be effected without departing from the scope of the novel concepts of the present invention.

What is claimed is:

1. A memory testing device for testing a memory under test having a flash write mode, comprising:
   a pattern generator for generating an address and data, including flash write data and mask data, for input into the memory under test which produces read out data, said pattern generator also generating control signals;

a buffer memory coupled to said pattern generator and having a data input terminal and at least the same storage capacity as the memory under test, said buffer memory being accessed by the address from said pattern generator;

a data register, coupled to said pattern generator, for storing, in response to one of the control signals generated by said pattern generator, the flash write data generated by said pattern generator;

a first multiplexer, coupled to said buffer memory, said pattern generator and said data register for selecting, in response to one of the control signals from said pattern generator, one of the flash write data stored in said data register and the data generated by said pattern generator, and for providing the selected data to the data input terminal of said buffer memory;

a logical comparator, coupled to the memory under test and said buffer memory, for receiving, as an expected value, data read out of said buffer memory, and for making a logical comparison between the data read out of said buffer memory and the read out data from the memory under test;

a mask controller including a mask data register, coupled to said pattern generator, for storing, in response to one of the control signals from said pattern generator, the mask data which is input to the memory under test by said pattern generator, and mask control means for prohibiting writing of the output data from said first multiplexer into said buffer memory for bits corresponding to the mask data stored in said mask data register; and a second multiplexer, coupled to said data register, said buffer memory, and said logical comparator, for selectively providing bits corresponding to one of the flash write data stored in said data register and the read-out data from said buffer memory in accordance with logical states of the corresponding bits of the mask data from said mask controller, the output data from said second multiplexer being provided as the expected value to said logical comparator;

said pattern generator including control signal generating means, coupled to said mask control means, for generating, as one of the control signals, a read/write control signal and providing it to said buffer memory via said mask control means for effecting read/write control of said buffer memory, so that, during each test cycle the readout of the row address area of the memory under test into which the flash write data has been written, the output expected value of said second multiplexer and the data read out of the memory under test are subjected to logical comparison by said logical comparator in a first half of each test cycle, and the data written in he data register while inhibiting the write of data in said buffer memory at each bit specified by the mask data from said mask controller is written into said buffer memory in a second half of each test cycle.

* * * * *

UNITED STATES PATENT AND TRADEMARK OFFICE
CERTIFICATE OF CORRECTION

PATENT NO. : 4,958,346

DATED : September 18, 1990

INVENTOR(S) : Kenichi Fujisaki

It is certified that error appears in the above-identified patent and that said Letters Patent is hereby corrected as shown below:

Col. 4, line 37, after "enabled" insert --by--;
      line 65, delete "a".

Signed and Sealed this

Seventh Day of April, 1992

Attest:

HARRY F. MANBECK, JR.

*Attesting Officer*     Commissioner of Patents and Trademarks